United States Patent
Kozakoff

[19]

[11] Patent Number: 6,097,271
[45] Date of Patent: *Aug. 1, 2000

[54] LOW INSERTION PHASE VARIATION DIELECTRIC MATERIAL

[75] Inventor: Dennis J Kozakoff, Marietta, Ga.

[73] Assignee: Nextronix Corporation, Marietta, Ga.

[*] Notice: This patent issued on a continued prosecution application filed under 37 CFR 1.53(d), and is subject to the twenty year patent term provisions of 35 U.S.C. 154(a)(2).

[21] Appl. No.: 08/832,169

[22] Filed: Apr. 2, 1997

Related U.S. Application Data

[60] Provisional application No. 60/014,661, Apr. 3, 1996.

[51] Int. Cl.[7] .............................. H01P 1/20; H01P 3/08; B32B 5/16; B32B 18/00
[52] U.S. Cl. ................. 333/204; 333/238; 333/246; 343/700 MS; 428/323; 428/325; 428/368; 428/457; 428/901
[58] Field of Search .................... 428/457, 901, 428/913, 323, 325, 403, 368; 333/202, 204, 205, 208, 209, 211, 238, 246; 343/700 MS

[56] References Cited

U.S. PATENT DOCUMENTS

| | | | |
|---|---|---|---|
| 3,557,334 | 1/1971 | Lewis | 219/10.55 |
| 3,696,314 | 10/1972 | Kell et al. | 333/73 |
| 3,713,051 | 1/1973 | Kell | 333/73 |
| 4,240,027 | 12/1980 | Larsen et al. | 324/57 |
| 4,475,092 | 10/1984 | Epsom et al. | 333/206 |
| 4,489,293 | 12/1984 | Fiedziuszko | 333/202 |
| 4,661,787 | 4/1987 | Lang | 333/22 |
| 5,153,537 | 10/1992 | Desmarest | 333/1.1 |
| 5,189,078 | 2/1993 | Johnson et al. | 523/137 |
| 5,390,073 | 2/1995 | McMillan | 361/327 |
| 5,391,430 | 2/1995 | Fabish et al. | 428/328 |
| 5,435,745 | 7/1995 | Kudo et al. | 342/1 |
| 5,469,128 | 11/1995 | Kawanashi et al. | 333/22 |
| 5,668,557 | 9/1997 | Kawahata | 343/700 MS |

OTHER PUBLICATIONS

"Dispersion of Absorption in Dielectrics," Journal of Chemical Physics, vol. 9, Apr. 1941, authored by Kenneth S. Cole and Robert H. Cole, pp. 341–351.

"The Properties of Artificial Dielectrics Comprising Arrays of Conducting Elements," Radio Section, Paper No. 1472, 1952, Authored by M.M.Z. Kharadly and Willis Jackson.

*Primary Examiner*—Paul Thibodeau
*Assistant Examiner*—Holly Rickman
*Attorney, Agent, or Firm*—Morris, Manning & Martin, LLP

[57] ABSTRACT

This invention is directed to an apparatus for transmitting an electromagnetic wave. The apparatus includes a dielectric material with a permittivity that decreases with increasing frequency over an operating frequency bandwidth that includes the frequency of the electromagnetic wave. With this behavior, the electrical or phase length of the dielectric material remains relatively constant and independent of frequency over the operating band, a feature that is highly advantageous for many important applications including circuit boards, radomes, and antennas. In addition, the dielectric material can be engineered to exhibit this behavior at a desired frequency, including frequencies in the millimeter, microwave, VHF and UHF frequency ranges. In a preferred embodiment, the dielectric material is an artificial dielectric manufactured by mixing conductive particulate into a host dielectric material. The conductive particulate can be microspheres or microfibers particularly with poor or medium conductivities, that have determined shapes and that are mixed in a volumetric proportion with the host dielectric material, to achieve the desired permittivity versus frequency behavior. With the microfibers, the maximum loss tangent occurs off the center frequency of the operating frequency bandwidth so that constant phase behavior can be obtained with relatively little wave transmission loss. The apparatus can also include a conductive material disposed in contact with the dielectric material, for transmitting the electromagnetic wave. The invention also includes related methods.

26 Claims, 6 Drawing Sheets

LOW INSERTION PHASE VARIATION DIELECTRIC MATERIAL

CROSS-REFERENCE TO RELATED APPLICATION

This application claims priority benefits of provisional application number 60/014,661 entitled "Zero Phase Dielectric" filed Apr. 3, 1996 naming Dennis J. Kozakoff as the sole inventor.

BACKGROUND OF THE INVENTION

1. Field of the Invention

This invention is directed to a dielectric material and method for its manufacture, for use in the transmission of electromagnetic waves. The dielectric material can also be used in a variety of applications, including, for example, various transmission media such as microstrip, strip line or coaxial lines, or as a radome to protect an antenna from exposure to the environment.

2. Description of the Related Art

From electromagnetic theory, it can be shown that a coaxial transmission line of length L has a phase length given by the following equation:

$$\psi = 2\pi L \lambda \sqrt{\varepsilon} = \frac{2\pi L f \sqrt{\varepsilon}}{c} \quad (1)$$

where $\psi$ is the electrical or phase length of the dielectric material used in the transmission line (in radians), L is the length of the transmission line (in meters), $\lambda$ is the wavelength of the electromagnetic wave transmitted on the line (in meters), $\varepsilon$ is the relative dielectric constant of the transmission line (a dimensionless quantity), f is the frequency of the electromagnetic wave transmitted in the dielectric material (in Hertz), and c is the velocity of light (in meters per second). The relative permittivity of common dielectrics used in industry is approximately constant over the frequency range of devices or components constructed from such materials. Accordingly, as indicated by equation (1), the electrical length $\psi$ of the coaxial transmission line increases with the operating frequency, a phenomenon that leads to undesirable effects in many applications. For example, the increase in electrical length $\psi$ is the cause of frequency limitations in many series-fed antenna arrays due to antenna beam steers introduced by the phase change with frequency. The increase in phase length with increasing frequency is also the cause of frequency limitations in microstrip antenna elements, filters and many other devices. It would be desirable to provide a dielectric material for use in the transmission of electromagnetic waves that does not suffer from frequency limitations due to variations in phase length with respect to frequency.

SUMMARY OF THE INVENTION

The invented apparatuses and methods overcome the above-noted disadvantages. An apparatus of this invention includes a dielectric material that has a permittivity that decreases with increasing wave frequency over an operating frequency bandwidth. The dielectric material can be selected or controlled by the materials and manner of its manufacture to exhibit this permittivity-versus-frequency behavior over an operating frequency bandwidth that includes the frequency of an electromagnetic wave that is desired to be transmitted with the material.

The dielectric material can be a polar or Debeye material that exhibits the desired permittivity versus frequency behavior. In a preferred embodiment, the dielectric material is an artificial dielectric composed of conductive particulate dispersed in a host dielectric material.

The host material is preferred to be a plastic substance. The conductive particulate can be composed of microspheres, microfibers or other shapes that are relatively small to allow uniform mixing with the host material. For use at millimeter, microwave, UHF or VHF wave frequencies, the particulate can be made poorly or moderately conductive, for example, by forming a thin conductive metal layer on an insulative microsphere through a technique such as sputtering or chemical vapor deposition (CVD), or by using a particulate composed of a poorly or, moderately conductive material such as carbon, stainless steel or nickel, for example. Thus, with such artificial dielectric material, the desired decrease in permittivity with increasing wave frequency can be controlled to occur at frequencies at which such behavior was not possible before this invention. In addition, through the use of an artificial dielectric formed of microfibers, the maximum wave loss tangent does not occur at the center of the frequency bandwidth over which the dielectric exhibits the desired permittivity versus frequency behavior as it does with Debeye materials, a highly advantageous effect in which the benefits of constant phase behavior can be obtained without the penalty of significant attenuation of the electromagnetic wave. The invented apparatus can also include a conductive material disposed in contact with the dielectric material exhibiting the desired permittivity-versus-frequency behavior, that is used to transmit the electromagnetic wave. The invention can be advantageously applied to circuitboards, transmission lines (including microstrip, strip line and coaxial lines, for example), waveguides, antennas, radomes and the like to increase the bandwidth of such devices beyond that attainable before this invention.

This invention also includes several methods. A first method of this invention includes the steps of determining a frequency of an electromagnetic wave to be transmitted in a conductive material, selecting a dielectric material having a property in which a permittivity of the dielectric material decreases with increasing frequency over a frequency bandwidth including the electromagnetic wave's frequency, and forming a conductive material in contact with the dielectric material, for transmission of the electromagnetic wave.

The invention also includes a second method that includes the steps of determining a frequency of an electromagnetic wave to be transmitted in a dielectric material, and forming the dielectric material so that the material has a property in which a permittivity of the dielectric material decreases with increasing frequency over a bandwidth including the frequency of the electromagnetic wave. The second method can also include a step of forming a conductive material on the dielectric material for transmission of the electromagnetic wave.

These together with other objects and advantages, which will become subsequently apparent, reside in the details of construction and operation of the invented apparatuses and methods as more fully hereinafter described and claimed, reference being had to the accompanying drawings, forming a part hereof, wherein like numerals refer to like parts throughout the several views.

DESCRIPTION OF THE PREFERRED EMBODIMENTS

1. General Principles of the Invention

Figure 1:
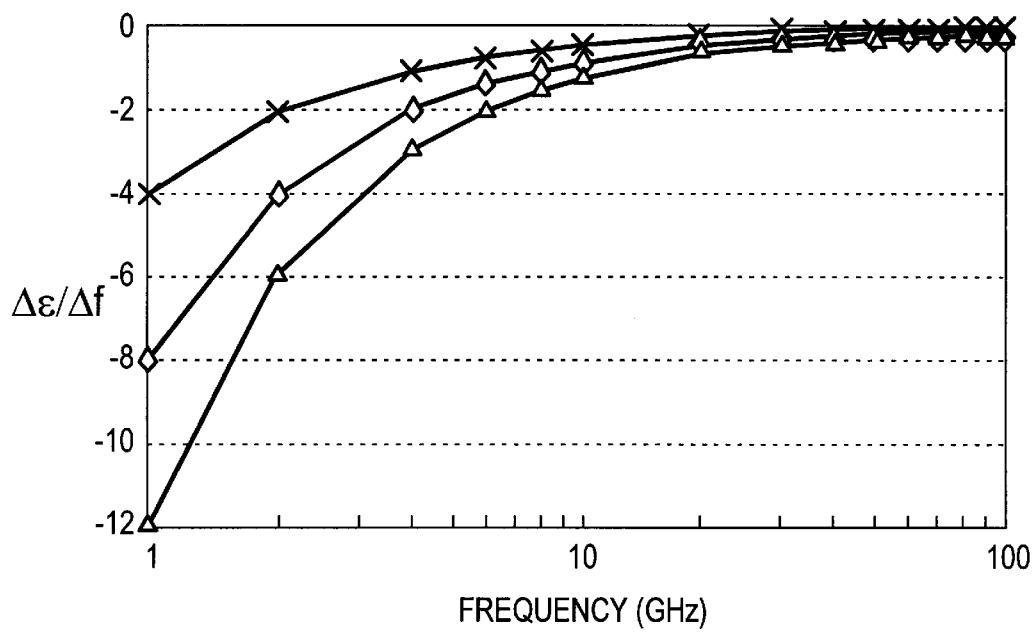
FIG. 1 is a graph of $\Delta\epsilon/\Delta f$ as a function of frequency for different dielectric materials.

The dielectric material disclosed in this document has a permittivity that decreases monotonically as frequency increases over an operating frequency bandwidth. This effect can be obtained over UHF, VHF, microwave or millimeter wave regimes (i.e., from $10^6$ to $10^{12}$ Hertz) at which such behavior could not be obtained before this invention. Over the operating band, the net electrical phase shift through a transmission line filled with the invented material (e.g., strip line, microstrip, or coaxial transmission lines) can have a much smaller change with frequency variation as compared to a similar line filled with a normal dielectric material with a permittivity that is a constant. In accordance with this invention, a dielectric material exhibiting the desired decrease in permittivity with increased frequency, can be used as a dielectric circuit board material upon which can be formed microstrip antennas or other electrical components. The use of a dielectric material exhibiting the desired permittivity versus frequency behavior can be used to greatly extend the useful bandwidth of such circuit board devices. Also, the material of this invention can be molded into appropriate shapes for use with radomes to protect antennas from the surrounding environment or conditions, and will permit a greater radome transmission bandwidth compared to existing radome materials. The invented material has other applications as well, as will become clear from the detailed description.

Equation (1) can be used to determine the required relationship needed to maintain the electrical or phase length $\psi$ constant over a range of frequencies for a coaxial transmission line. Specifically, the behavior of the dielectric material should exhibit the following relationship:

$$\sqrt{\varepsilon} = \frac{\sqrt{\varepsilon_m}}{f} \quad (2)$$

where $\varepsilon_m$ is approximately constant. The electrical length $\psi$ of the transmission line will be frequency-independent over the band of frequencies for which the dielectric material exhibits a behavior that satisfies or approximates equation (2). Although equation (2) applies to coaxial transmission lines, in general, a dielectric material that exhibits a behavior in which the permittivity decreases with increasing frequency will provide at least some benefit toward maintaining constant electrical length $\psi$ over an operating band of frequencies. For example, although the behavior of a microstrip departs to an extent from the coaxial case of equations (1) and (2) due to its different configuration and fringe effects, a microstrip with a dielectric material exhibiting the behavior of equation (2) will nonetheless be effective for use in maintaining a constant electrical length $\psi$ over a relatively broad frequency band.

The slope of the desired frequency-versus-permittivity behavior can be determined by differentiating equation (1) with respect to both frequency and permittivity, and setting the result to zero as follows:

$$\Delta\Psi = \frac{\partial \Psi}{\partial f} \cdot \Delta f + \frac{\partial \Psi}{\partial \varepsilon} \cdot \Delta\varepsilon. \quad (3)$$

From equation (1), the following relations can be derived:

$$\frac{\partial \Psi}{\partial f} = \frac{2\pi L\sqrt{\varepsilon}}{c}, \quad (4)$$

and $$\frac{\partial \Psi}{\partial \varepsilon} = \frac{1}{2}\frac{2\pi L f}{c\sqrt{\varepsilon}}. \quad (5)$$

Substituting equations (4) and (5) into equation (3) yields:

$$\frac{\Delta\varepsilon}{\Delta f} = \frac{-2\varepsilon}{f}. \quad (6)$$

which is the slope of change with respect to relative permittivity required for dielectric material to exhibit the desired frequency-versus-permittivity behavior. FIG. 1 is a graph of $\Delta\varepsilon/\Delta f$ as a function of frequency for dielectric materials with different relative permittivities.

2. Polar Dielectric Materials

The above analysis showed that a dielectric material whose relative permittivity decreased with frequency can be used to produce a constant phase transmission line. One class of dielectric materials that exhibit this behavior are polar dielectric materials.

The classical theory of polar materials and liquids was due to the work of P. Debye. In the Debye model, the real and imaginary parts of the permittivity are given by the following relations:

$$\varepsilon' = \varepsilon_\infty + \frac{(\varepsilon_s + \varepsilon_\infty)}{1 + (\omega\tau)^2} \quad (7)$$

$$\varepsilon'' = \frac{(\varepsilon_s - \varepsilon_\infty)\omega\tau}{1 + (\omega\tau)^2} \quad (8)$$

where $\varepsilon'$ is the real part of the permittivity, $\varepsilon''$ is the imaginary part of the permittivity, $\tau$ is the relaxation time for the polar dielectric, the permittivity $\varepsilon_s$ is the polar material's permittivity at relatively low wave frequencies, and the permittivity $\varepsilon_\infty$ is the polar material's permittivity at relatively high wave frequencies. The relaxation time $\tau$ varies for different materials and can be temperature-dependent. The frequency of maximum rate of change of permittivity with respect to frequency is a function of the relaxation time and corresponds to:

$$f_0 = \frac{1}{2\pi\tau}. \quad (9)$$

The center frequency $f_0$ can be used to center the operating frequency band of an artificial dielectric material to obtain the desired permittivity versus frequency behavior at a desired frequency(ies).

The real and imaginary parts of the permittivity of a polar dielectric material can be used to derive a loss tangent as follows:

$$\tan\delta = \frac{\varepsilon'}{\varepsilon''} = \frac{(\varepsilon_s - \varepsilon_\infty)\omega\tau}{[1 + (\omega\tau)^2]\varepsilon_\infty + (\varepsilon_s - \varepsilon_\infty)}. \quad (10)$$

Figure 2:
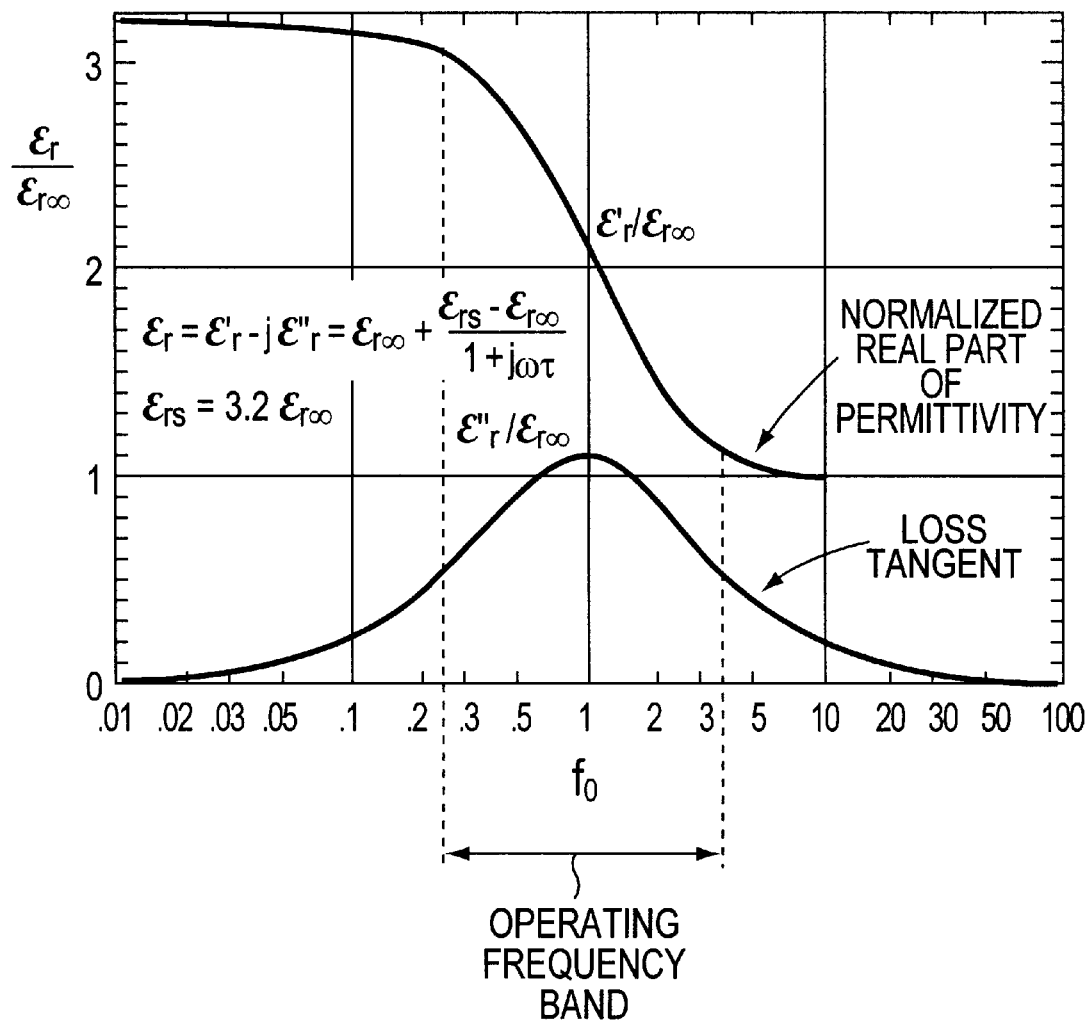
FIG. 2 is a graph of permittivity and loss tangent versus frequency of a dielectric material in accordance with this invention.

The loss tangent can be a convenient measure of the relationship between the real and imaginary parts of the permittivity of a polar dielectric material, and is shown in FIG. 2. The Debeye behavior of polar materials has the correct sense for use in the subject invention, i.e., the dielectric permittivity montonically decreases with increasing frequency, as shown in FIG. 2. However, the frequency of maximum negative rate-of-change of the permittivity also corresponds to the frequency of greatest loss tangent, as illustrated in FIG. 2 for a dielectric material having $\epsilon_s = 3.2\epsilon_\infty$.

Figure 3:
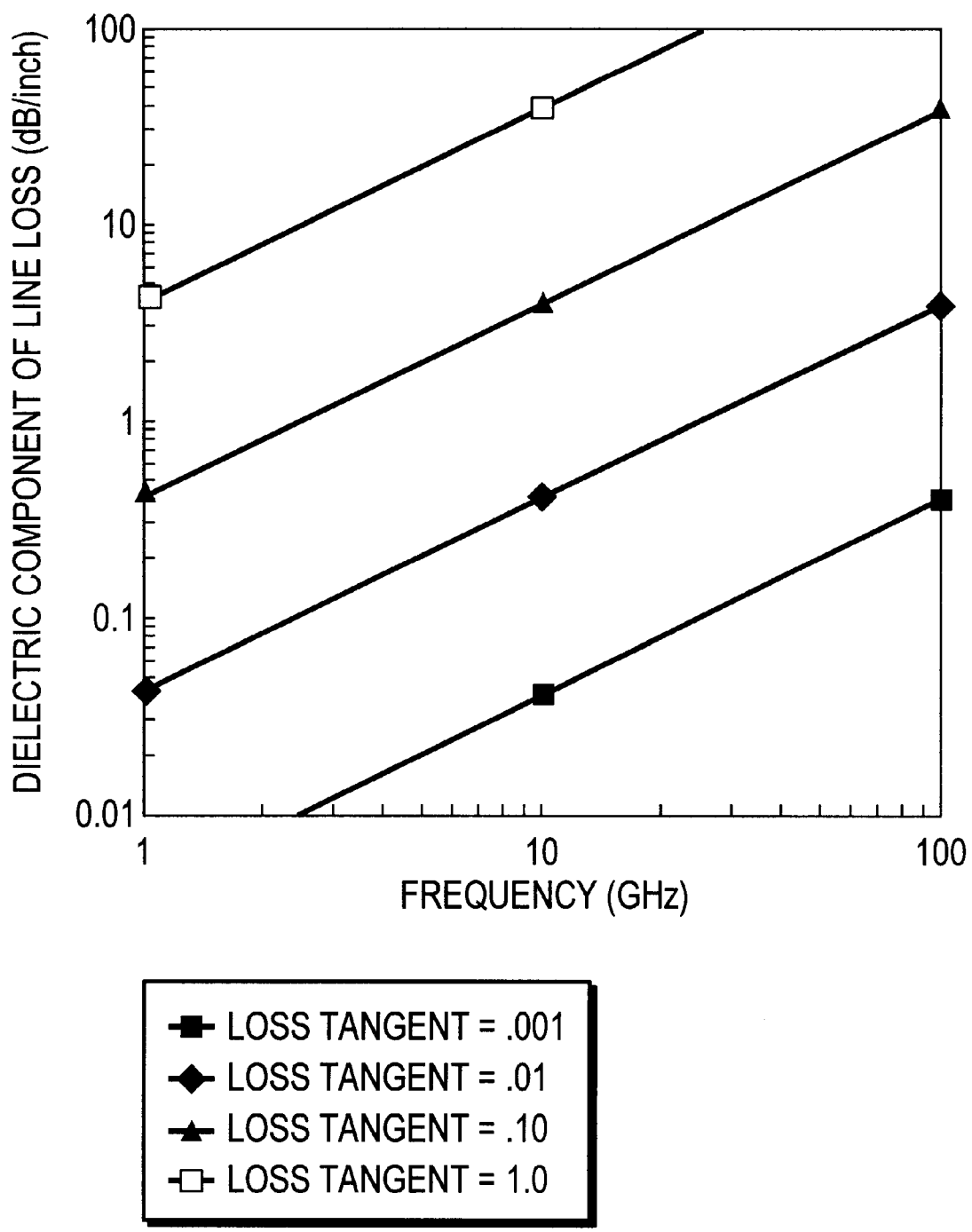
FIG. 3 is a graph of dielectric component of line loss versus frequency for various loss tangents.

Operating near the relaxation frequency at which maximum absorption occurs may be acceptable if the overall losses can be tolerated for a given application of the dielectric material. For example, in a microwave stripline transmission line fabricated from such material, the transmission line loss in decibels per inch versus wave frequency for various loss tangents of the dielectric material filling for the transmission line is shown in FIG. 3. An examination of FIG. 3 will allows estimation of the largest acceptable value of loss tangent for a particular application of a stripline transmission line. Similar line loss versus wave frequency for different loss tangents are available or can be empirically determined for transmission media other than stripline.

3. Artificial Dielectrics

Debeye-type dielectrics, as they occur in nature, have been studied and mathematically characterized by Cole and Cole, Kazanatsev et al., Kliem, King and Smith, Ongaro, and Winslow. The use of conductive particles within a non-conductive host medium to achieve artificial dielectric (Debeye type) behavior was discussed in Bespyatykh et al. for ferromagnetic particles, by Gauss for conductive microfibers, and by Kharadly and Jackson for conductive microspheres. However, although meritorious for the objectives of the research performed, none of the research work mentioned immediately above disclose dielectric materials that exhibit a decrease in permittivity versus frequency over wave frequencies that would be of commercial interest, such as the millimeter, microwave, UHF and VHF ranges. Furthermore, the dielectric material used in connection with this research work is not suitable for use in commercial applications due to structural and electrical performance limitations. In addition, this research work does not disclose the use of artificial dielectrics with desired permittivity versus frequency behavior for use in transmissive media such as circuit board material or radomes.

In accordance with this invention, the use of artificial dielectrics provides the capability to control the overall permittivity versus frequency behavior of a dielectric material mixture over a desired operating frequency range, as well as obtaining a dielectric material with a monotonically decreasing permittivity with increasing frequency. The invented artificial dielectric material disclosed herein includes conductive microspheres or microfibers within a host dielectric material, in which various artificial dielectric properties are selected. Henceforth, the conductive microspheres or microfibers may be referred to as "particulate."

A. Microspheres in a Host dielectric Material

For microspheres mixed into a host dielectric material, the following equations can be used to control the behavior of the resulting dielectric:

$$\varepsilon_s = \varepsilon_h(1 + 3v) \quad (11)$$

$$\varepsilon_\infty = \varepsilon_h(1 + 3v\beta) \quad (12)$$

$$v = \frac{\pi}{6}d^3 N = \frac{\pi}{6}\left(\frac{d}{a}\right)^3 \quad (13)$$

$$\beta = \frac{\varepsilon'_m - \varepsilon_h}{\varepsilon'_m + 2\varepsilon_h} \quad (14)$$

$$\tau = \frac{(\varepsilon'_m + 2\varepsilon_h)\varepsilon_o}{\sigma_m} \quad (15)$$

$$f_0 = \frac{1}{2\pi\tau}\frac{\sqrt{\varepsilon_s}}{\sqrt{\varepsilon_\infty}} \quad (16)$$

where $\epsilon_h$ is the permittivity of the host dielectric material, v is the volume loading of the microspheres in the host dielectric material (assumes values between 0 and 1), N is the reciprocal of the average spacing a in the host dielectric material, $\epsilon_m$ is the real part of the permittivity of the microspheres, $\epsilon_0$ is the permittivity of free space (8.854× $10^{-12} C^2/N \cdot m^2$), $\sigma_m$ is the conductivity of the microspheres, and $f_0$ is the center frequency at which the dielectric material exhibits the desired frequency versus permittivity behavior.

Kharadly and Jackson developed empirical data for polystyrene spheres suspended in nitrobenzene with volume loadings of 9.8%, 27.5% and 46.5%. They observed Debeye type behavior but primarily at very low wave frequencies. The inventor has determined that the low frequency of the Debeye behavior in the Kharadly and Jackson experiment was due at least to a significant degree to the low conductivity of the spheres. Therefore, in accordance with this invention, the microsphere conductivity is preferably increased with a poor or medium conductivity material, generally in a range from $10^2$ to $10^{10}$ mhos per meter. The microsphere can be formed by mixing the conductive material in powdered form, for example, into a ceramic material that is formed into microspheres, and hardened by heating. Also, the microspheres can be made by forming conductive coatings on ceramic or glass microspheres by sputtering or chemical vapor deposition, for example. The thickness of these coatings affects the conductivity, and can thus be used to achieve a specific conductivity. The following exemplary materials can be used as microsphere materials, mixture components to be mixed into a matrix material to form the microspheres, or coatings formed on the microspheres:

TABLE 1

Conductivities for Selected Materials

| Material | Conductivity (mhos per meter) |
|---|---|
| Carbon | $6.7 \times 10^4$ |
| Stainless Steel | $1.4 \times 10^6$ |
| Nickel | $5.8 \times 10^9$ |

Microspheres that can be used to practice this invention are commercially available from a wide variety of sources. For example, microspheres with or without conductive coatings are available from Minnesota Mining & Manufacturing Co. of St. Paul, Minn., the PQ Corporation, or Inco, Ltd. of Mississauga, Ontario. In general, it is preferred that the microspheres be relatively small, about a millimeter or less in diameter, so that they can be more uniformly mixed into a host dielectric material. In addition, the volume loading of the microspheres into the host dielectric material should not be so much that it adversely affects the structural integrity of the host dielectric material, a factor that depends to a degree upon the particular type of host material used. Suitable host dielectric materials include a wide variety of plastics such as acrylics, epoxies, urethanes, polyvinyl chloride (PVC), silicones and others. Such plastics are widely available in commerce. These plastics are generally such that they have a liquid form in which the microspheres can be mixed into the host material, and a solid form upon curing so that the dielectric material maintains its shape for use as a circuit board material or wave-transmissive radome, for example. The host material can be selected for its permittivity or for its weathering capabilities. For example, urethanes are highly durable and suitable for use even in relatively harsh operating environments.

In general, the electrical specifications such as operating frequency bandwidth, are determined in advance for the particular application in which the artificial dielectric is to be used. The artificial dielectric material is designed and manufactured to obtain the desired frequency versus permittivity behavior over the predetermined operating frequency bandwidth. In equations (11)–(16), the pre-specification of the operating frequency band generally determines $f_0, \epsilon_s, \epsilon_\infty$. Based on preselection of the host dielectric material having a known electrical permittivity, $\epsilon_h$ is determined, and by preselection of a microsphere type, its diameter d, is likewise determined. The remaining variables of equations (11)–(16), namely, v, a, $\epsilon'_m$, $\sigma_m$, $\tau$, and $\beta$, can be readily determined as there are six equations and six unknowns. Thus, equations (11)–(16) are solved for the volume loading (v) and the microsphere permittivity and conductivity ($\epsilon'_m$, $\sigma_m$)

B. Microfibers in a Host Dielectric Material

The use of conductive microfibers may be more attractive than conductive microspheres, because required particulate loading in the host dielectric material is less for the same target electrical performance. Gauss has published formulas showing that the dielectric behavior of a mixture of conductive microfibers in a non-conducting host material is a function of fiber length and diameter, conductivity and volume loading. This is summarized by:

$$\frac{\varepsilon}{\varepsilon_h} = 1 + \frac{\frac{x}{1-\frac{x}{3}}}{1+\frac{j\omega\tau}{1-\frac{x}{3}}} \quad (17)$$

where $x=v/(3Ln(L/d)(l/d)^2)$, v is the volumetric loading of fibers per unit of the dielectric host medium (dimensionless), L is the length of fibers (m), d is the diameter of fibers (m), $\tau=\epsilon_0/(\sigma\ln(L/d)(l/d)^2)$, and $\sigma$ is the conductivity of the fibers (mhos per meter). Also, $\epsilon_h$ is the relative permittivity of the host dielectric material. The formula of equation (17) can be rearranged into a more convenient form by defining a constant:

$$\frac{\varepsilon}{\varepsilon_h} = 1 + \frac{A}{1+j\omega\tau B}. \quad (18)$$

The inventor has found that for some fiber types a much closer comparison can be obtained between theoretical and measured data by using a Navriliak-Negami model. In fact, some fibers exhibit a permittivity characteristic with a maximum loss tangent at a higher frequency than the frequency at which the greatest change of permittivity with increasing frequency is observed. A preferred type of microfiber that exhibits this behavior is composed of stainless steel. Carbon fibers can also be used for the microfibers, although they generally do not exhibit a maximum loss tangent that is off-center with respect to the center frequency of the desired permittivity versus frequency behavior. Such stainless steel or carbon fibers are commercially available in a variety of different diameters from various commercial sources, including Bekaert Fiber Technologies™, Inc. of Belgium and Precision Fibers™, Inc. of Rhode Island. The fibers can be selected for their diameter and cut to a desired length for the desired electrical performance for the artificial dielectric material. The length of the microfibers is generally preferred to be less than one inch to reduce occurrences of contact with other microfibers when dispersed in the host material. Also, the diameter of the microfibers is preferred to be less than one millimeter, yet not so thin that they easily break when handled. The preferred conductivity range for the microfibers is from $10^2$ to $10^{10}$ mhos per meter although other values can be used. A wide variety of plastic materials can be used for the host dielectric material, including acrylics, epoxies, urethanes, polyvinyl chloride (PVC), silicones and others. The volume loading of the microfibers in the host dielectric material should not be so great as to produce a large number of contacting microfibers that adversely affect the desired electrical performance characteristic or so great that the structural integrity of the artificial dielectric is compromised.

The Navriliak-Negami model is given by:

$$\frac{\varepsilon}{\varepsilon_h} = 1 + \frac{A}{[1+(j\omega\tau B)^{1-\alpha}]^{\beta-1}} \quad (19)$$

In equation (18), A and B are given by:

$$A = \frac{x}{1-\frac{x}{3}} \quad (20)$$

$$B = \frac{1}{1-\frac{x}{3}} \quad (21)$$

Constants $\alpha$ and $\beta$ are usually determined empirically for a given fiber type. This can be accomplished by making experimental microfiber dielectric substrates with various fiber loadings and lengths, and measuring the permittivity versus frequency characteristics. The experimental data can be curve fit to equation (19) to determine the constants $\alpha$ and $\beta$.

The rate of change of permittivity as a function of frequency can be found by differentiating equation (18) to obtain:

$$\frac{d\varepsilon}{df} = \frac{j(1-\beta)(1-\alpha)2\pi D\varepsilon_h}{[1+(j2\pi fD)^{1-\alpha}]^\beta (j2\pi fD)^\alpha} \quad (22)$$

By appropriate adjustment of the variables of Equation (22), a desired rate of change of permittivity with respect to frequency can be obtained.

In summary, for conductive microfiber-loaded dielectric materials, the center frequency may be found from equation (9), the value for the dielectric constant from equation (17) or (19)–(21), and the rate of change of permittivity with frequency from equation (22). Also, the loss tangent can be obtained by evaluating the real and imaginary parts of equation (17) or (19), that is:

$$\tan\delta = \frac{Re(\varepsilon)}{Im(\varepsilon)}. \qquad (23)$$

4. The Preferred Manufacturing Process

Figure 4:
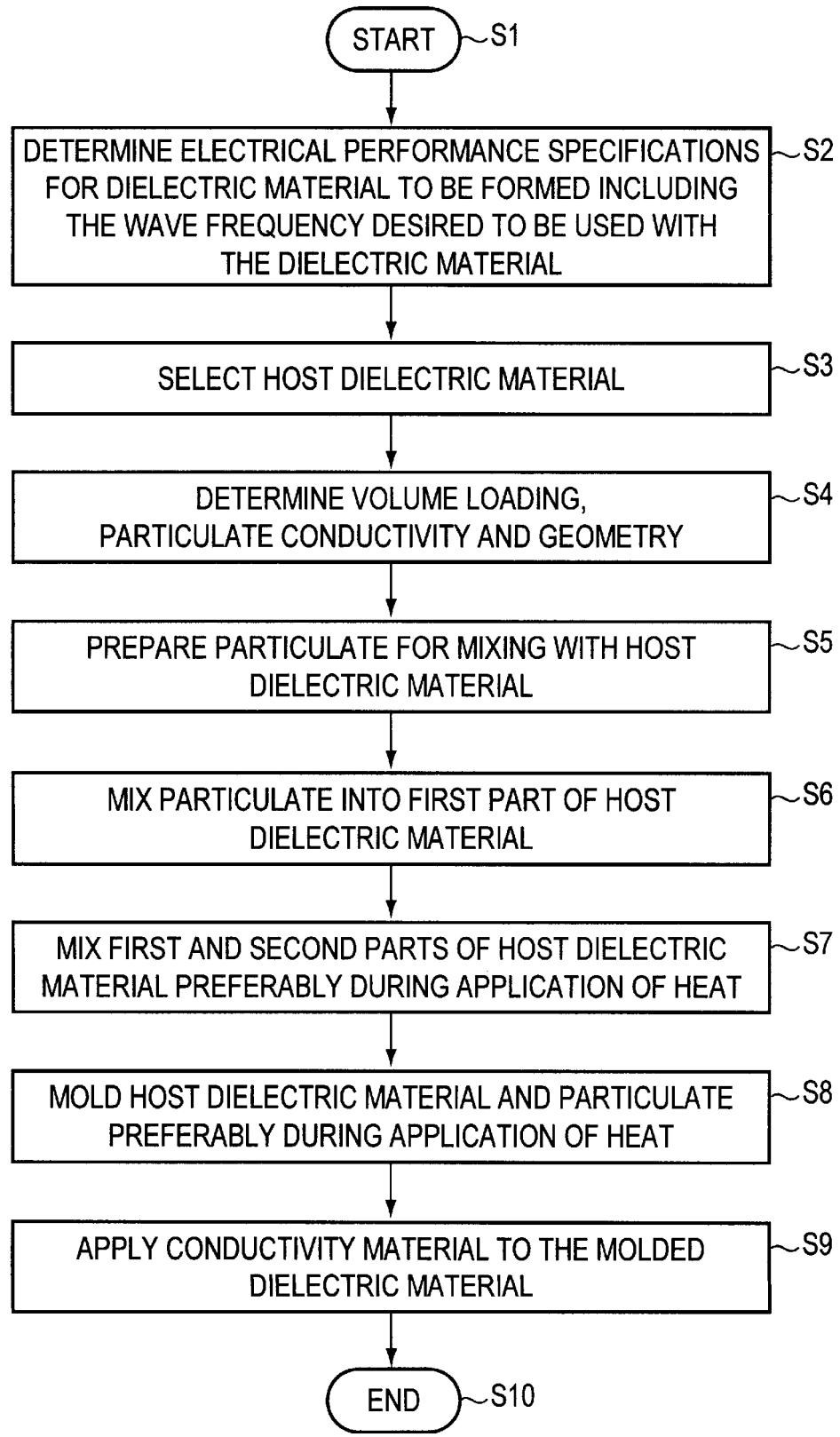
FIG. 4 is a flow diagram for a preferred method of manufacturing the apparatus of this invention.

The preferred method for making a low phase variation printed circuit board or other transmissive material is shown in the process flow chart of FIG. 4. The process shown assumes the host dielectric material for the substrate is a two-part system for rapid cure. However, it is possible to use a dielectric material with a one part system if a slow cure material is used, since preparing and mixing the particulate into the dielectric host material can be a time-consuming process. The following steps are used in the manufacture process.

In step S1 of FIG. 4, the manufacture process begins. In step S2, the desired permittivity versus frequency characteristics over an operating frequency bandwidth must be determined based upon the application in which the dielectric material is to be used. Step S2 includes the determination of the wave frequency(ies) that are to be transmitted with the dielectric material formed with the process. In step S3, a host dielectric material having a known electrical permittivity, is selected for use in the manufacture of the artificial dielectric material. The selection of the host dielectric material can be for its permittivity, or its material qualities such as strength or durability. In step S4, based upon the desired electrical performance of the dielectric material to be formed and the selected host material, the required volume loading, conductivity and geometry of a selected type of particulate such as microspheres of microfibers, are determined. For example, equations (7)–(16) can be used to determine the volume loading, conductivity and geometry of the microspheres. On the other hand, for microfibers, equations (7)–(10) and (17)–(23) can be used to determine the volume loading, conductivity and geometry of the microfibers. Preferably, the equations used to characterize the particulate and the resulting dielectric material are programmed into and solved by a personal computer because the number of computations required to solve the equations can be significant. Upon obtaining a particulate with the proper conductivity and desired geometry, the particulate and dielectric host material are weighed and adjusted to obtain the volume loading needed to achieve the desired frequency to permittivity behavior over the desired operating band of wave frequencies.

The particulate is prepared for mixing into the lower viscosity part of the two part host dielectric material in step S5. To add particulate of any kind, especially fibers, into a dielectric host binder or polymer medium requires the correct methodology. Failure to follow the correct procedures as outlined below will cause the resultant product to have lumpy physical properties as the result of poor particulate dispersion. Inherent with poor dispersion is poor electrical performance.

In mixing a dry product with a wet product, the liquid resists breaking of its surface by either liquids or solids. This phenomenon is referred to as surface tension. In step S5, the particulate is prepared for mixing with the host dielectric material by application of a surfactant to the particulate. The applied surfactant reduces the surface tension of the liquid dielectric host material so that the particulate can be readily mixed into such material. A non-ionic surfactant can be used to prevent the particulate from carrying an electrical charge (an ionic surfactant is not desired for use because it charges the particulate, rendering the particulate difficult to mix into a dielectric host medium). The particulate is also wet with a solvent that is similar to the solvent present in the dielectric host medium, whether aqueous or aromatic, preferably in a quantity just sufficient to wet the surface area of the particulate. For water-based dielectric host materials, water is used as the solvent, and for aromatic-solvent based dielectric host materials, "Cooper's™" solvent is preferred. Also, a dispersing agent is preferably used to force the particulate to disperse in the dielectric host material. For example, Bergen's Berma Wet™ 1000 or ATU™ by Byke-Chemie™ can be used as a dispersing agent at ½% of solvent by weight. If the particulate is microfiber, care must be taken to avoid fracturing upon mixing the microfibers with the host material. Preferably, hand sheer with a paddle is applied for approximately fifteen minutes until the particulate is uniformly mixed in the host dielectric material in step S6.

In step S7, the particulate and dielectric material mixture resulting from step S6 is mixed into the second component of the two-part dielectric host material until a homogenous blend is achieved. The mixing operation can be accomplished with a vacuum mixer such as a VISCO-MAX™ available from Epworth, Morehouse and Cowles, Inc. of Fullerton, Calif., drawing about two to three pounds per square inch vacuum. A bow tie mixer paddle should be employed at very low sheer. Preferably, this step is performed with the application of heat at 150° F.–170° F. for the purpose of maintaining low viscosity and optimal cure for the dielectric material.

After the particulate is dispersed in the dielectric host material, in step S8, the dielectric material is molded in a predetermined shape. For a circuit board material, the target shape is usually a relatively thick flat sheet. On the other hand, for a radome, the target shape depends upon the geometry of the antenna to be protected by the radome. The mold can be manufactured by a die manufacturer, for example, or can be more conveniently formed with paperboard treated with mold release.

If the molded dielectric material is to be used as a circuit board material, an additional step is required. Specifically, a conductive material is applied to the molded dielectric material in step S9. This can be accomplished with a variety of well-known devices and techniques, including the use of a press that applies the conductive material such as a copper foil to both sides of the dielectric material under elevated pressure and temperature. The conductive material can also be applied or patterned through selective chemical deposition or etching, for example. In step S10, the process of FIG. 4 ends.

Figure 5:
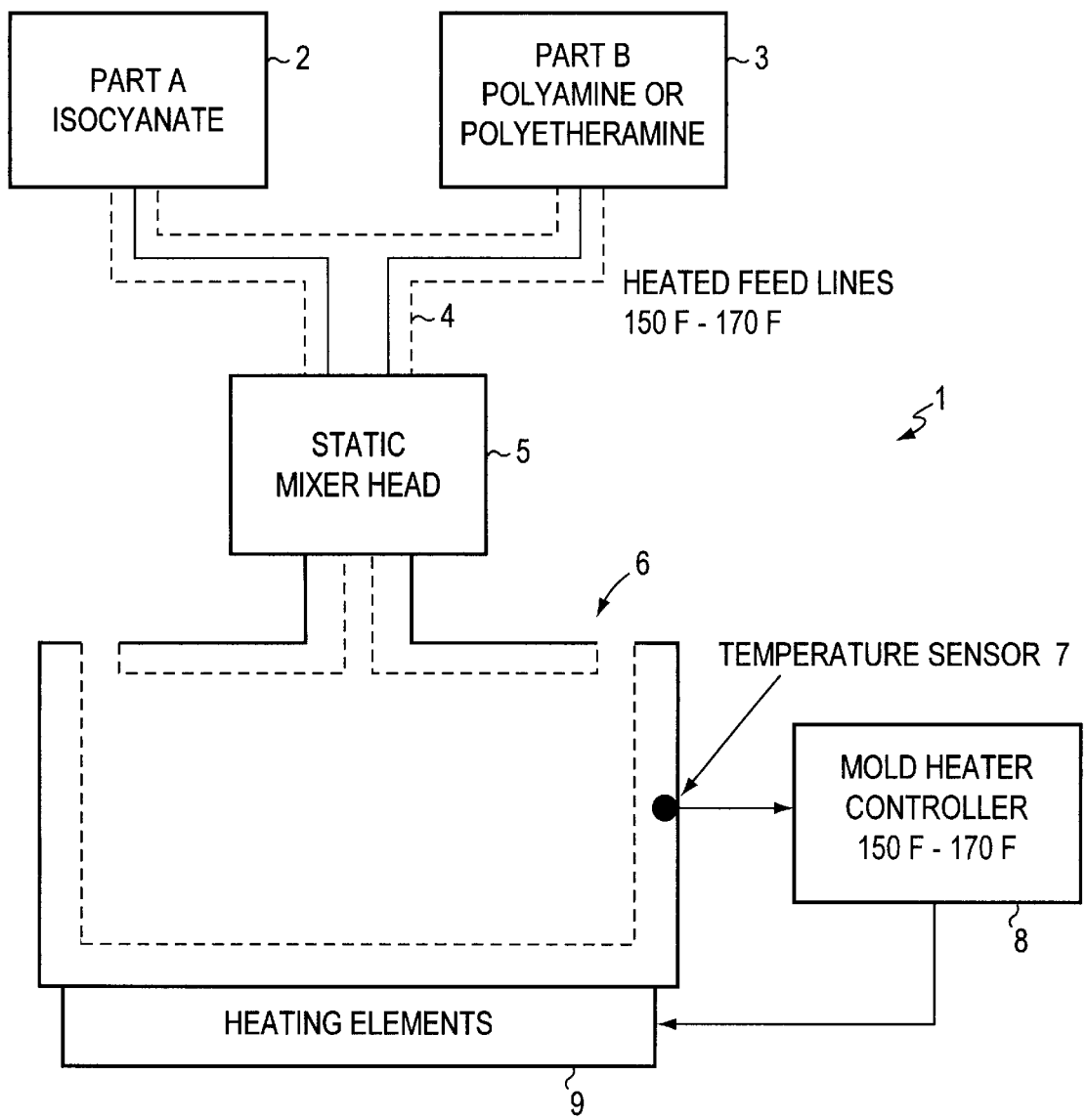
FIG. 5 is a block diagram of a machine for making the dielectric material of this invention.

FIG. 5 discloses a machine 1 for molding dielectric substrates in accordance with this invention. The machine is capable of performing steps S7 and S8 of FIG. 4. The machine includes containers 2, 3, heated lines 4, static mixer head 5, mold 6, temperature sensor 7, mold heater controller 8, and heating elements 9. The machine receives supplies of first and second parts of a two-part dielectric material from respective containers 2, 3. Although the machine can be applied to virtually any one or two part polymer system, a two-part polyurea elastomer system has been found particularly effective by the inventor. The types of dielectric host materials that can be used include dielectric materials such as PSE 360-50, PSE 352-07, PSE 661-45, etc. commercially available from Flexible Products™ Company of Marietta, Ga. When using this type of material, the particulate will be added to part B (polyamine or polyetherarnine) which is lower in viscosity than the part A (isocyanate). The heated lines 4 are coupled to allow the first and second parts of the dielectric material to flow from the containers 2, 3 to the static mixer head 5. The lines 4 are heated with temperature-controlled heating elements (not shown) for the purpose of maintaining low viscosity and optimal cure for the dielectric material. In the static mixer head, the two parts of the dielectric material are mixed together, and the mixed dielectric material flows from the static mixer head into the mold 6. The mold is heated to a temperature of at least 150° F. The temperature sensor 7 is coupled to sense the mold temperature, and that generates a signal based on the sensed temperature. The temperature sensor is coupled to supply its signal to the mold heater controller 8. The mold heater controller compares the sensed mold temperature with a predetermined temperature level of at least 150° F. set manually, for example, and generates a heat signal that tends to control the mold temperature at the predetermined temperature level. The controller 8 is coupled to supply its heat signal to the heating elements 9 to generate heat for the mold. Before filling the mold with dielectric material, the mold is treated with a mold release such as Generation 2000™ Teflon™ available from Rite Off™, Inc. of Seaford, Del. Depending upon the catalyst applied to either part A or part B, the dielectric material cure time can range from twenty seconds to one minute. Thereafter, the mold is opened and the dielectric substrate is removed upon cooling sufficiently. If used as a circuit board material, the molded dielectric material is cleaned with solvent to prepare for metallization with a conductive material such as copper foil.

Figure 6:
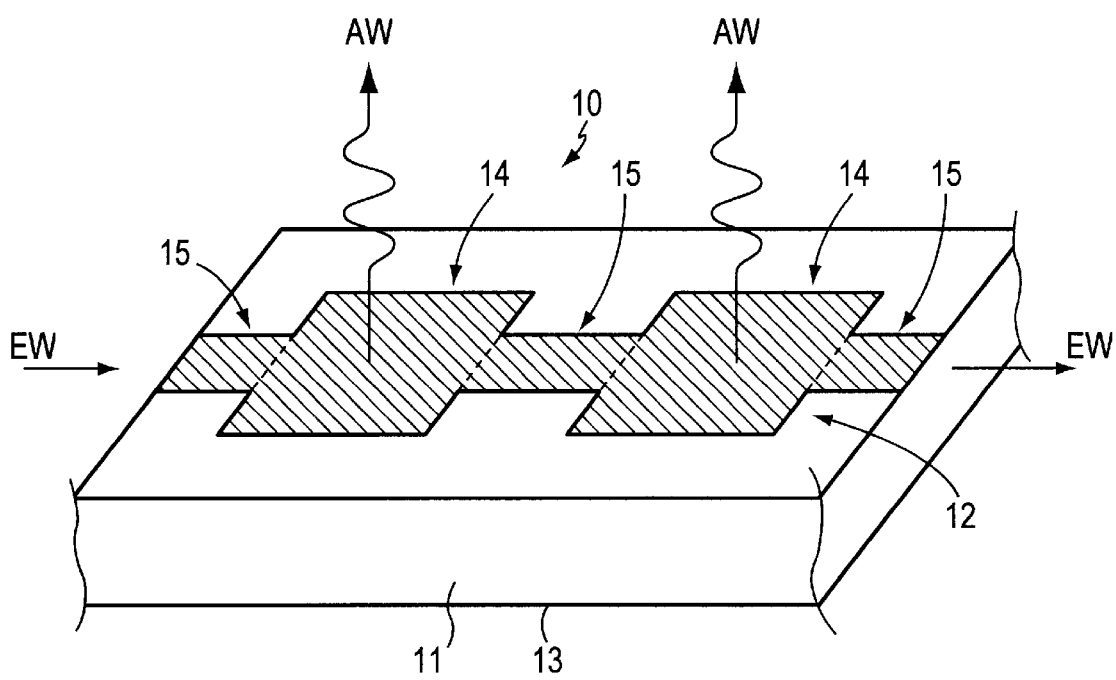
FIG. 6 is a block diagram of a circuit board with conductive material formed thereon, in accordance with the subject invention.

FIG. 6 shows an apparatus 10 in accordance with this invention. The apparatus includes a dielectric circuit board material 11, and a printed conductive material 12 and ground plane 13 formed on the circuit board material. The conductive material includes two antennas 14 coupled by microstrips 15. An electromagnetic wave EW travels through the series-fed antenna array from which the antennas emit antenna waves AW. Because of the advantageous ability of the invented dielectric material to decrease in permittivity with increasing frequency over the operating frequency bandwidth, beam steering problems do not adversely affect the series-fed microstrip antenna array. Thus, the constant phase dielectric material greatly increases the frequency bandwidth of the microstrip antennas, and also provides low-cost series-fed antennas, thus eliminating the need in many cases for a corporate feed network.

5. Additional Uses for the Invented Apparatus and Method

Fresnel zone reflector antennas can be manufactured from the low-phase dielectric substrate materials. The low phase variation material renders the zone phase relationships independent over frequency over a predetermined bandwidth, as well as the distance (in wavelengths) from the feed to the reflector surface. These features produce an extended frequency range and low-cost Fresnel reflector antenna.

In the following claims, "dielectric means" is used to refer to the dielectric material disclosed herein and equivalents thereof, as provided in 35 U.S.C. §112, Sixth Paragraph. Similarly, in the following claims, reference to "conductive means" is intended to correspond to the conductive material as described herein and equivalents thereof for purposes of 35 U.S.C. §112, Sixth Paragraph.

The many features and advantages of the present invention are apparent from the detailed specification and thus, it is intended by the appended claims to cover all such features and advantages of the described apparatuses and methods which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

What is claimed is:

1. An apparatus for use with an electromagnetic wave, the apparatus comprising:

a dielectric material for transmitting the electromagnetic wave, the dielectric material including a host dielectric material including a curable plastic material; and a plurality of particles having a conductivity from $10^2$ to $10^{10}$ mhos per meter, the particles dispersed in the host dielectric material, the electromagnetic characteristics of the dielectric material and the particles, including the conductivity of the particles, and volume loading of the particles in the host dielectric material, predetermined so that the dielectric material has a permittivity that decreases with increasing frequency, and is approximately proportional to the inverse square of the fequency over a preselected operating frequency bandwidth of the apparatus that includes a frequency in a range from $10^6$ to $10^{12}$ Herz the host dielectric material and particles dispersed therein molded in a predetermined shape; and a conductive material for transmitting the electromagnetic wave, together with the dielectric material, so that a phase relationship at different positions along the conductive material remains relatively constant with variation in the electromagnetic wave's frequency within the operating frequency bandwidth due to the decrease of the penittivity with increasing frequency, the conductive material including a printed metal foil disposed in contact with the dielectric material, the metal foil configured as at least one circuit element for transmitting the electromagnetic wave.

2. An apparatus as claimed in claim 1, wherein a phase difference of the electromagnetic wave between first and second different positions on the conductive material along a direction of propagation of the electromagnetic wave, is maintained approximately constant for frequencies of the electromagnetic wave within the frequency bandwidth.

3. An apparatus as claimed in claim 1, wherein the dielectric material is selected based on a permittivity of the dielectric material at zero frequency, a permittivity of the dielectric material at infinite frequency, and a relaxation time of the dielectric material.

4. An apparatus as claimed in claim 3, wherein a center frequency of the frequency bandwidth over which the dielectric material exhibits the property, is determined based on the relaxation time of the dielectric material.

5. An apparatus as claimed in claim 1, wherein a range of frequencies in which the dielectric material and conductive material exhibit decreasing permittivity with increasing wave frequency is determined by the permittivity of the host dielectric material, the particle permittivity, conductivity and geometry, and the volume loading of the particles in the host dielectric material.

6. An apparatus as claimed in claim 5, wherein the range of frequencies in which the dielectric material and conductive material exhibit decreasing permittivity with increasing frequency is determined by the shape of the particles.

7. An apparatus as claimed in claim 1, wherein at least some of the particles are composed of microspheres.

8. An apparatus as claimed in claim 7, wherein the microspheres are composed of ceramic material.

9. An apparatus as claimed in claim 8, wherein the microspheres have a lossy material dispersed in the ceramic material to control conductivity of the microspheres.

10. An apparatus as claimed in claim 9, wherein the lossy material is carbon powder.

11. An apparatus as claimed in claim 7, wherein the microspheres have a conductive coating.

12. An apparatus as claimed in claim 11, wherein the thickness of the conductive coating of the microspheres is controlled to determine a center frequency of the operating frequency bandwidth over which the dielectric material and the conductive material exhibit decreasing permittivity with increasing wave frequency.

13. An apparatus as claimed in claim 1, wherein the particles include microfibers.

14. An apparatus as claimed in claim 13, wherein the microfibers are composed of carbon.

15. An apparatus as claimed in claim 13, wherein the microfibers are composed of stainless steel.

16. An apparatus as claimed in claim 13, wherein the dielectric material and conductive material have a center frequency for the operating frequency bandwidth over which the permittivity decreases with increasing frequency, that does not coincide with a maximum loss tangent for the wave transmitted with the dielectric material and conductive material.

17. An apparatus as claimed in claim 13, wherein the particles have a conductivity that causes the operating frequency bandwidth to be in the range from $10^6$ to $10^{12}$ Hertz.

18. An apparatus as claimed in claim 1, wherein the permittivity is proportional to the inverse square of the frequency over the operating frequency bandwidth.

19. An apparatus as claimed in claim 1, wherein the conductive material is configured on the dielectric material so that the apparatus is a microstrip transmission line.

20. An apparatus as claimed in claim 1, wherein the conductive material is configured on the dielectric material so that the apparatus is an antenna array with antenna elements coupled by microstrip transmission lines.

21. An apparatus as claimed in claim 1, wherein the conductive material is configured on the dielectric material so that the apparatus is a stripline transmission line.

22. An apparatus as claimed in claim 1, wherein the conductive material is positioned on a surface of the dielectric material to form a waveguide.

23. An apparatus as claimed in claim 1, wherein the conductive material is patterned on the dielectric material.

24. An apparatus as claimed in claim 1, wherein the dielectric material and conductive material are configured as a microwave circuitboard.

25. An apparatus for use with an electromagnetic wave, the apparatus comprsing:
   a dielectric material transmissive to the electromagnetic wave, the dielectric material having a permittivity that decreases with increasing frequency, and is approximately proportional to the inverse square of the frequency over a preselected operating frequency bandwidth of the apparatus that includes a frequency in a range from $10^6$ to $10^{12}$, the dielectric material including a host dielectric material; and
   a plurality of conductive particles dispersed in the host material; and
   a conductive material transmissive to the electromagnetic wave and disposed in contact with the dielectric material, the conductive material and the dielectric material transmitting the electromagnetic wave.

26. An apparatus as claimed in claim 25, wherein the conductive material is patterned on the dielectric material to form a microwave circuitboard.

* * * * *